United States Patent [19]

Stepan

[11] 3,768,351

[45] Oct. 30, 1973

[54] METHOD AND APPARATUS FOR FORMING HOLES IN A MATERIAL

[75] Inventor: William E. Stepan, Brookfield, Ill.

[73] Assignee: GTE Automatic Electric Laboratories Incorporated, Northlake, Ill.

[22] Filed: May 8, 1972

[21] Appl. No.: 250,881

[52] U.S. Cl. .......................... 83/55, 83/451, 83/521

[51] Int. Cl. .......................... B26f 1/02

[58] Field of Search .......................... 83/50, 55, 451, 521, 83/520

[56] References Cited

UNITED STATES PATENTS

| | | | |
|---|---|---|---|
| 3,492,900 | 2/1970 | Hill et al. | 83/521 X |
| 3,368,439 | 2/1968 | Bungay, Jr. | 83/521 X |
| 3,524,372 | 8/1970 | Albrecht | 83/451 |
| 3,290,975 | 12/1966 | Caesar | 83/451 X |

*Primary Examiner*—J. M. Meister
*Attorney*—K. Mullerheim et al.

[57] ABSTRACT

A method and apparatus of aligning photographic film used in the production of printed circuit boards and punching registery holes in specific relationship to the circuit patterns on them. Two or more alignment marks are exposed with the circuit or wiring pattern on a photographic material. After the necessary photographic processing techniques have been performed, the final photographic film which is to be used in the manufacture of the printed circuit board is placed on and aligned with respect to a punching apparatus and thereafter the required hole array is punched into the film.

10 Claims, 8 Drawing Figures

PATENTED OCT 30 1973 3,768,351

SHEET 2 OF 2

METHOD AND APPARATUS FOR FORMING HOLES IN A MATERIAL

This invention relates, in general, to an improved method an apparatus of aligning and forming holes in a specific relationship to a pattern on sheet material which is subject to dimensional changes during processing. More particularly, the invention relates to an improved method and apparatus of aligning photographic films used in the production of printed circuit boards and punching registery or tooling holes in a specific relationship to the circuit patterns on them.

In the fabrication of printed circuit boards, specific registery or tooling holes are required in the photographic artwork or film in order to align the circuit or wiring pattern on it to the substrate material. These holes must be in a specific relationship to the circuit patterns. When the printed circuit board to be produced contains more than one wiring layer, the location of the holes on the photographic film for each layer must be precisely located in order to obviate any pattern mismatch from layer to layer.

The conventional method for punching these holes in the photographic film employs the use of pre-punched film. In this process, the required holes are punched into the photographic film before it is exposed. The film is then placed over alignment pins on the exposure equipment and the circuit or wiring pattern is exposed on the film in relationship to the pins.

As an alternative to the use of pre-punched film, edge alignment techniques are sometimes used. In this method, the image is placed on the photographic film in relation to two of its edges. After all of the necessary photographic processing operations are completed, the required holes are then punched into the photographic film in relation to the same two edges to which the image was exposed.

In each of these two methods, there are inherent disadvantages. For example, in the process of developing photographic films, dimensional changes in the film frequently occur which are irreversible. For this reason, the spacing between the holes punched prior to developing, as in the pre-punched technique, is changed during the processing cycle. Hence, a loss of accuracy in the hole array exists on the final photographic film, irrespective of the accuracy to which they were initially punched. Although glass based materials are not affected by processing, the problems of drilling accurate holes in this material prohibits its use with this method.

With the use of the edge alignment technique, irregularities in the edges of the materials (especially since the edges are subject to handling damage) cause inaccuracies in the final punching operation, unless special precautions are taken. This method also requires the use of duplication of fixtures on the image exposing equipment, the contact printing frame, and on the final hole punching device, all of which may further add to the total accuracy loss.

Recently, a new technique of optical alignment and punching of the photographic film after processing has been developed. In this technique or system, a single punch is used, and alignment marks are placed on the photographic film at the locations where the holes are to be provided. The film is then placed in a fixture, aligned, and the alignment marks are punched out. The disadvantage of this system is that the effects of photographic processing size change appear in the hole array dimensions, thus the effects of the dimensional changes in the photographic film during processing are not compensated for when the holes are punched.

In accordance with the method and apparatus of the present invention, two alignment marks are exposed with the circuit or wiring pattern on a photographic material. These alignment marks which preferably are double crossline symbols are precisely located with respect to the circuit or wiring pattern. After the necessary photographic processing techniques have been performed, the final photographic film which is to be used in the manufacture of the printed circuit board is placed on and aligned to a fixture using these alignment marks, and the required hole array is punched into the film.

Generally, the fixture consists of six commercially available film punches which are affixed to a sturdy metal base plate. The punches are located so as to produce the desired hole array on a piece of photographic film within 0.0005 inches. Two microscope tubes are supported above the base plate in a fixed relationship to the punches. Included within each microsope is a crosshair reticle. Dowel pins, inscribed with crosshairs, are pressed into the base plate and are used for aligning the microscope crosshairs to the punch array to within 0.0005 inches. A film support plate, with a series of holes, is attached to the base plate between the punches. Through a series of channels, the holes in the film support plate are capable of being attached to the input of a vacuum pump.

In the operation of the alignment and punching fixture, the photographic film to be punched is placed on the film alignment plate and between the jaws of the punches. The film is manipulated unitl the alignment mark images are centered with the microscope crosshairs. A vacuum is then applied through the holes of the film support plate to hold the film in place and assure that the film is held flat. The holes are then punched, the vacuum is turned off, and the film is removed.

With the microscope arrangement, it is possible to locate the film alignment mark images to the microscope reticle within a few 10,000ths of an inch. In the cases where the photographic processing has created a dimensional change in the film, it is possible to align the film such that each alignment mark is mismatched to its corresponding microscope reticle by an equal but opposite amount. In this manner, the processing change is minimized, but the hole-to-hole spacing is not affected.

The advantages of the method and apparatus of the present invention are numerous. For example, the loss of tooling hole position accuracy due to film processing is eliminated. Furthermore, it is unnecessary to provide accurate alignment fixturing on the plotter used to expose the curcuit or wiring pattern to the photographic material, or in the photographic contacting frame. Further still, there is no dependence upon the edges of the photographic materials for alignment, and stable glass base photographic materials may be used throughout the photographic sequence up to the point where the final film copy is to be produced.

Accordingly, it is an object of the present invention to provide an improved method and apparatus of aligning and forming holes in a specific relationship to a pattern on sheet material which is subject to dimensional changes during processing.

A more specific object is to provide improved method and apparatus of aligning photographic films used in the production of printed circuit boards and punching registery or tooling holes in s specific relationship to the circuit or wiring patterns on them.

Still another object is to provide a method and aparauts of the above type wherein a fixture is used having mounted and located thereon hole punches to punch the holes and magnifying means having registration means for viewing and aligning the registration means with alignment marks on the photographic films to substantially eliminate errors in the location of the registery or the tooling holes due to dimensional changes in the photographic film during processing.

A still further object is to provide a method and apparatus of the above type wherein it is unnecessary to provide accurate alignment fixturing on the plotter used to expose the circuit or wiring pattern on the photographic material, or in the photographic contacting frame.

Still another object is to provide a method and apparatus for forming the registery or tooling holes in the photographic films used in the production of printed circuit boards which does not depend upon the edges of the photographic materials for alignment. Still another object is to provide a method and apparatus of the above described type wherein stable glass base photographic materials may be used throughout the photographic sequence up to the point where the final film copy is to be produced.

Other objects of the invention will in part be obvious and will in part appear hereinafter.

The invention accordingly comprises the several steps and the relation of one or more of such steps with respect to each of the others and the apparatus embodying features of construction, combination of elements and arrangements of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings, in which.

Similar reference characters refer to similar parts throughout the several views of the drawings.

As indicated above, in the fabrication of printed circuit boards, specific registery or tooling holes are required in the photographic film in order to align the circuit or wiring pattern to a substrate material. These holes must be in a specific relationship to the patterned image, and must be precisely located in order to obviate any pattern mismatch.

Figure 3:
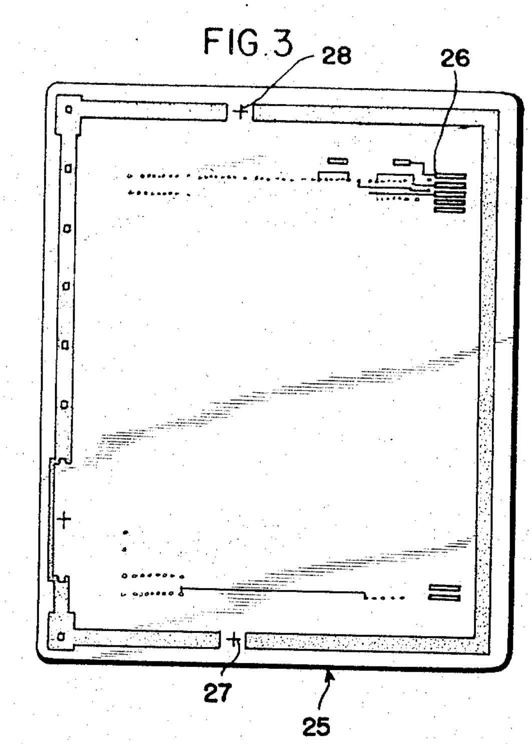
FIG. 3 is a top plan view of a photographic film used in the production of printed circuit boards, prior to punching the registery or tooling holes therein and generally illustrating the alignment marks provided thereon.

One such photographic film 25 is illustrated in FIG. 3. This photographic film 25 can have the circuit or wiring pattern generally illustrated by the reference numeral 26 exposed thereon. In this respect, the photographic film 25 can be prepared in a conventional fashion, using any one of the techniques presently used, such as, for example, by use of a plotter in the form of a numerically controlled graphic display table which is capable of selectively exposing photographic materials to create a printed circuit or wiring pattern. Another conventional technique commonly employed involves the use of a photographic reduction camera to reduce a relatively large hand or machine drawn image of the wiring pattern to the desired scale on the photographic material. As used herein, the terminology circuit or wiring pattern is intended to broadly include any photographic artwork which is exposed on a photographic film and used in the production of a printed circuit board.

The registery or tooling holes are provided in the photographic film 25 by a post processing punching technique, and for this purpose, at least a pair-of alignment marks 27 and 28 are exposed on the photographic film 25, along with the circuit or wiring pattern 26. By exposing the alignment marks on the photographic film 25 in this fashion, these marks are precisely located with respect to the pattern and should any dimensional changes occur in the photographic film during processing, the precise relationship of the alignment marks with respect to the pattern remains fixed. These alignment marks 27 and 28 preferably are in the form of a double crossline symbol, microscopic in size so as to necessitate the use of magnifying means such as a microscope to distinguish the spacing between the double crossline thereof. In an operable embodiment of the invention, thhe crosslines of the symbol are 0.150 inches in length and 0.002 inches in width. The spacing between the crosslines is 0.004 inches.

The photographic film 25 can be, for example, a polyester film, and materials of this type are subjected to dimensional changes which approximate 1 mil per inch. Accordingly, the dimensional changes will be the greatest over the longitudinal length of the film and the alignment marks 27 and 28, therefore, preferably are provided in spaced apart positions across the longitudinal length of the film, near the opposite edges thereof. In this fashion, the dimensional changes in the longitudinal length of the photographic film 25 can be compensated for. For example, the photographic films 25 generally are of a standard size such as 8 × 10 inches, or 16 × 20 inches. Of course, other sizes can be formed, and the film alignment and hole punching apparatus correspondingly proportioned. With an 8 × 10 inch photographic film, the alignment marks 27 and 28 can be spaced approximately 9 inches apart, and the photographic film can be aligned to produce the desired registery or tooling hole array within 0.0005 inches.

Figure 1:
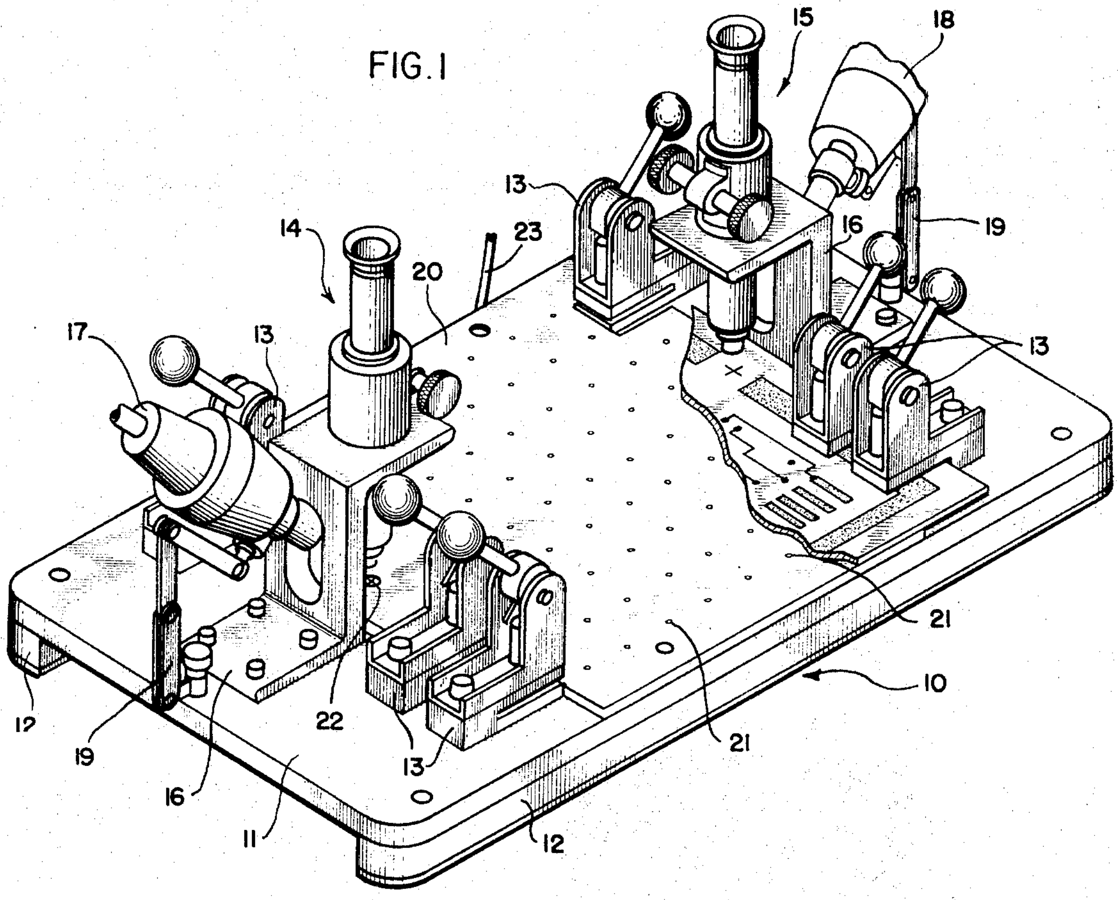
FIG. 1 is a perspective view of a film alignment and hole punching apparatus exemplary of a construction which can be used in accordance with a first embodiment of the invention.

The film alignment and hole punching apparatus 10 for providing the registery or tooling holes in the photographic film 25 is illustrated in FIG. 1, and it can be seen to include a base plate 11 having a pair of support legs 12 affixed along the length of two of the opposite edges thereof. A number of hole punches 13 (six in the illustrated embodiment) are fixedly secured to the base plate 11, and are located so as to produce the desired hole array in the photographic film 25. Two microscopes 14 and 15 are supported above the base plate 10, in a fixed relationship to the hole punches 13, by means of brackets 16. These microscopes 14 and 15 each includes a single crosshair reticle, generally represented by the crosslines 30 and 31 in FIGS. 5 and 6, and dowel pins 22 inscribed with single crosslines are pressed into the base plate 11 and are used for aligning the microscope crosshairs to the punch array to within 0.0005 inches. A pair of lights 17 and 18 are affixed to the base plate 11 by means of adjustable brackets 19, so as to be positionable to impinge light on the crosshairs inscribed on the dowel pins 22, or on the alignment marks 27 and 28 provided onthe photographic film 25.

A film support plate 20 is affixed to the base plate 11 and extends between the hole punches 13. This film support plate 20 has a series of holes in it which are coupled by means of a series of channels to a vacuum hose 23 which is coupled to a vacuum pump (not shown), to apply a vacuum to hold the photographic film 25 in place on the film support plate 20.

Figure 4:
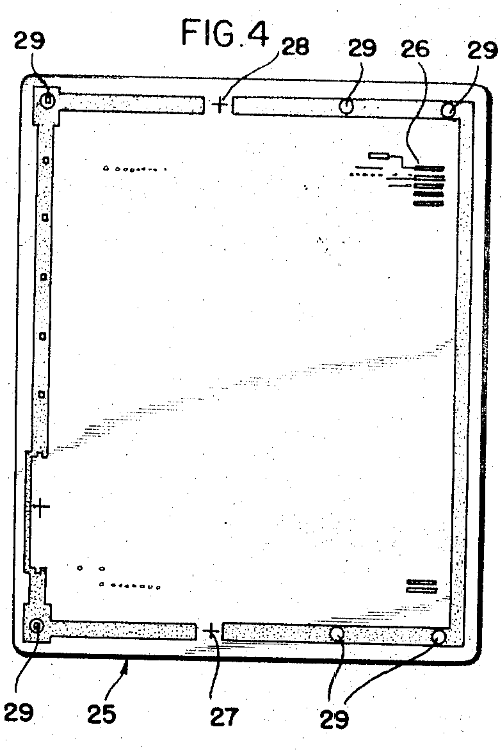
FIG. 4 is a top plan view of the photographic film of FIG. 3, illustrating the registery or tooling hole array punched.
Figure 5A:
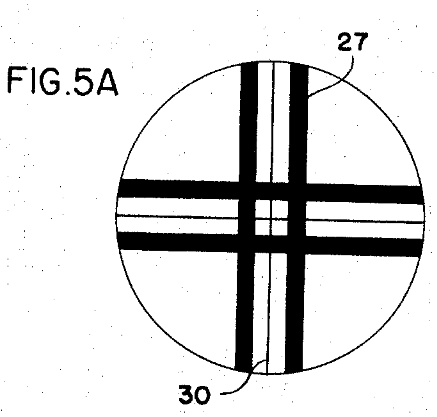
FIGS. 5 and 6 are enlarged views of the alignment marks, generally illustrating the manner in which they are aligned with the registration means of the film alignment and hole punching apparatus, to accurately punch the holes in the photographic film.
Figure 5B:
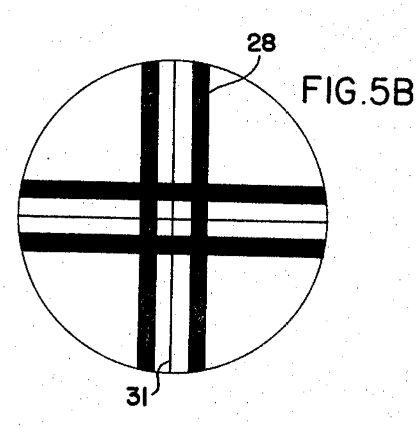

The procedure in punching the hole array in the photographic film 25 is as follows. The photographic film first is placed atop the film support plate 20 of the film alignment and hole punching apparatus 10, between the jaws of the hole punches 13. The photographic film then is manipulated over the film support plate 20 until the double crossline symbols are centered with the single crosslines 30 and 31 of the microscopes 14 and 15, as illustrated in FIGS. 5a and 5b. The photographic film can be easily manipulated by hand, by simply pressing the thumbs against the film support plate 20 and the photographic film 25 so that the movement of the thumbs is translated to the photographic film. In operation, it has been found that an unskilled operator can accomplish the alignment of the photographic film, quit easily. Once the double crossline alignment marks 27 and 28 have been aligned to the microscope single crosslines 30 and 31, vacuum is applied to the film support plate 20, to releasably secure the photographic film in alignment and flat on the film support plate. After the vacuum has been applied, the alignment of the crosses should be rechecked. If the film is properly aligned, the hole punches 13 each is operated to perforate the holes in the photographic film. After punching all of the holes, the hole punches are released, and the vacuum is turned off and the photographic film 25 removed. The holes 29 punched in the photographic film 25 are illustrated in FIG. 4.

Figure 6A:
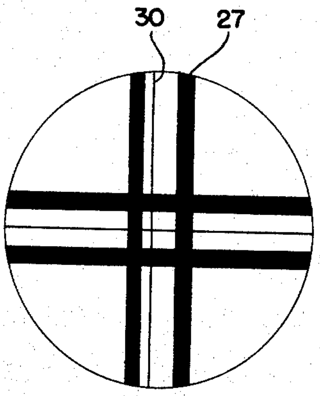
Figure 6B:
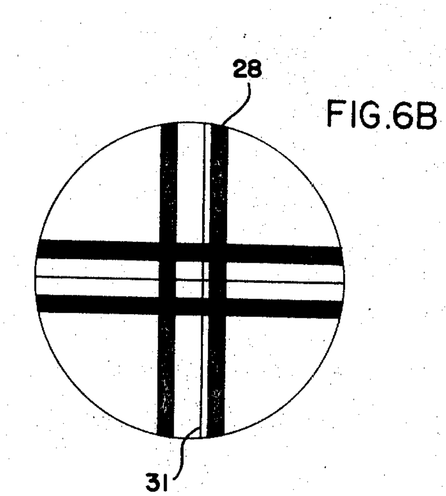

If the photographic film has, in fact, experienced dimensional changes during processing, it will be impossible to center both of the double crosslines on the photographic film with respect to the microscope single crosslines. To compensate for this dimensional change, and to minimize registration error, the photographic film is aligned to the film alignment and hole punching apparatus 10 such that alignment mark is mismatched to its corresponding microscope crossline by an equal but opposite amount, as illustrated in FIGS. 6a and 6b. it will be appreciated the aligning the alignment marks in this fashion will effectively spread the effects of the dimensional changes over the longitduinal length of the photographic film, thereby minimizing an error.

Figure 2:
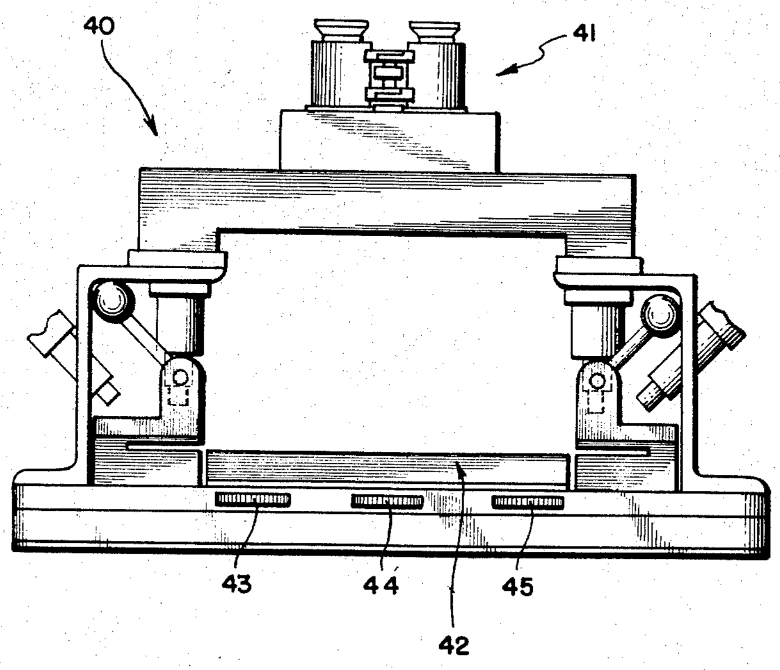
FIG. 2 is a side plan view of a flim alignment and hole punching apparatus exemplary of a construction contemplated by a second embodiment of the invention.

In FIG. 2 there is illustrated a film alignment and hole punching apparatus 40 which is generally like the one shown in FIG. 1. In this case, however, the two microscopes 14 and 15 are replaced with a stereo microscope 41 so that both alignment marks 27 and 28 can be viewed simultaneously, rather than one at a time.

The film support plate 42 furthermore is adapted to be physically adjusted in the X, Y and O axis, by means of the control knobs 43, 44 and 45, respectively, which are coupled to appropriate mechanisms (not shown) for effecting such movement. With this arrangement, the photographic film 25 is placed on the film support plate 42 and aligned by eye as accurately as possible. vacuum then is applied to the film support plate 42, as described above, to secure the photographic film flat on the film support plate. The control knobs 43–45 then are manipulated to align the alignment marks 27 and 28 with the crosslines 30 and 31, im the manner described above, and the hole punches 13 then operated to punch the holes 29 in the film. The vacuum then is released, and the film removed.

It will thus be seen that the objects set forth above, among those made apparent from the preceding description, are efficiently attaind and certain changes may be made in carrying out the above method and in the construction set forth. Accordingly, it is intended that all matter contained in the above description or shown in the accompanying drawings shall be interpreted as illustrative and not in a limiting sense.

Now that the invention has been described, what is claimed as new and desired to be secured by Letters Patent is:

1. A method of aligning photographic films used in the production of printed circuit boards and punching tooling holes in a specific relationship to the circuit patterns on them using a fixture having fixedly mounted and located thereon hole punches to punch the holes and magnifying means having registration means for viewing and aligning the registration means with alignment marks on the photographic films to substantially eliminate errors in the location of the tooling holes due to dimensional changes in the photographic film during processing comprising the steps of:

a. providing on said photographic film at least two spaced alignment marks which are precisely registered with respect to said circuit patterns and which are located to be viewed with respective ones of said fixedly mounted magnifying means;
b. placing said photographic film in said fixture beneath said fixedly mounted hole punches and said fixedly mounted magnifying means;
c. manipulating said photographic film to simultaneously align all of said alignment marks thereon with respective ones of said registration means of said fixedly mounted magnifying means;
d. operating said fixedly mounted hole punches when said registration means and said alignment marks are aligned to punch said tooling holes in said photographic film.

2. The method of claim 1, wherein said alignment marks are provided on the photographic films by exposing them thereon simultaneously with the circuit patterns, whereby said alignment marks are precisely registered with respect to said circuit patterns even after said photographic films are processed.

3. The method of claim 1, wherein said alignment marks are provided on said photographic film along the longitudinal length thereof in spaced-apart positions near the opposite edges of said photographic film.

4. The method of claim 1, wherein said alignment marks each comprises a double crossline symbol.

5. The method of claim 4, wherein said registration means each comprises a single crossline in said magnifying means, said photographic film being manipulated to align said single crosslines with the centers of said double crossline symbols.

6. The method of claim 4, wherein said registration means each comprises a single crossline in said magnifying means, said photographic film being manipulated to align it such that each of said double crossline symbols is mismatched to its corresponding single crossline by an equal but opposite amount.

7. The method of claim 1, further including the step of fixedly securing said photographic film with respect to said fixture after it is aligned and before punching said tooling holes.

8. The method of claim 7, wherein said photographic film is secured to said fixture by applying a vacuum beneath said photographic film.

9. The method of claim 7, further including the step of rechecking the alignment of said photographic film after it has been secured to said fixture and before punching said tooling holes.

10. A method of aligning and forming holes in a specific relationship to a pattern on sheet material which is subject to dimensional changes during processing using a fixture having fixedly mounted and located thereon means for forming the holes and magnifying means having registration means for viewing and aligning the registration means with alignment marks on the sheet material comprising the steps of:

a. providing on said sheet material at least two spaced alignment marks which are precisely registered with respect to said pattern and which are located to be viewed with respective ones of said microscopic means;
b. placing said sheet material in said fixture beneath said fixedly mounted hole forming means and said magnifying means;
c. manipulating said sheet material to simultaneously align all of said alignment marks thereon with respective ones of said registration means of said fixedly mounted magnifying means;
d. operating said fixedly mounted hole forming means when said registration means and said alignment marks are aligned to form said holes in said sheet material.

* * * * *